United States Patent
Liu et al.

(10) Patent No.: US 9,930,797 B1
(45) Date of Patent: Mar. 27, 2018

(54) LATCH MECHANISM CAPABLE OF UNLOCKING TWO ELECTRONIC MODULES SEPARATELY AND PORTABLE ELECTRONIC DEVICE THEREWITH

(71) Applicant: Wistron Corporation, New Taipei (TW)

(72) Inventors: Che-Wen Liu, New Taipei (TW); I-Chun Chen, New Taipei (TW); Mei-Shan Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/619,530

(22) Filed: Jun. 11, 2017

(30) Foreign Application Priority Data

Feb. 8, 2017 (TW) .............................. 106104006 A

(51) Int. Cl.
*H05K 5/00* (2006.01)
*H05K 5/02* (2006.01)
*H01R 13/717* (2006.01)

(52) U.S. Cl.
CPC ....... *H05K 5/0256* (2013.01); *H01R 13/7175* (2013.01); *H05K 5/0021* (2013.01); *H05K 5/0221* (2013.01)

(58) Field of Classification Search
None
See application file for complete search history.

(56) References Cited

U.S. PATENT DOCUMENTS

| | | | | |
|---|---|---|---|---|
| 7,789,437 B2* | 9/2010 | Sheng | .................... | G06F 1/1658 |
| | | | | 292/137 |
| 7,793,312 B2* | 9/2010 | Yang | ..................... | G06F 1/1616 |
| | | | | 292/137 |
| 9,036,335 B2* | 5/2015 | Liang | ................... | H05K 5/0221 |
| | | | | 361/679.01 |
| 9,422,082 B2* | 8/2016 | Nolan | .................... | B65D 11/18 |
| 2006/0186673 A1* | 8/2006 | Wong | .................. | E05B 47/0002 |
| | | | | 292/175 |
| 2006/0261600 A1* | 11/2006 | Lee | .......................... | E05C 1/10 |
| | | | | 292/175 |
| 2008/0129054 A1* | 6/2008 | Tremble | ................ | E05B 15/102 |
| | | | | 292/33 |
| 2009/0111296 A1* | 4/2009 | Zhu | ........................ | H05K 7/142 |
| | | | | 439/78 |

(Continued)

*Primary Examiner* — Xanthia C Cunningham
(74) *Attorney, Agent, or Firm* — Winston Hsu

(57) ABSTRACT

A latch mechanism capable of unlocking a first electronic module and a second electronic module separately includes an operating component, a base, a first moving component, a second moving component, a first latch component, and a second latch component. The operating component moves relative to the base along different directions to selectively drive one of the first moving component and the second moving component. When the first moving component is moved to drive the first pivoting component to pivot, the first latch component can be disengaged from the first electronic module, which unlocks the first electronic module. When the second moving component is moved to drive the second pivoting component to pivot, the second latch component can be disengaged from the second electronic module, which unlocks the second electronic module. It allows users to replace the first electronic module or the second electronic module separately.

22 Claims, 12 Drawing Sheets

(56) References Cited

U.S. PATENT DOCUMENTS

| | | | | |
|---|---|---|---|---|
| 2012/0044654 A1* | 2/2012 | Hsiu | ............... | E05C 1/06 |
| | | | | 361/747 |
| 2012/0144749 A1* | 6/2012 | Lin | ............... | E05B 17/002 |
| | | | | 49/394 |
| 2014/0037372 A1* | 2/2014 | Chang | ............... | H05K 5/0221 |
| | | | | 403/327 |
| 2014/0092533 A1* | 4/2014 | Liang | ............... | H05K 5/0221 |
| | | | | 361/679.01 |
| 2016/0224073 A1* | 8/2016 | Chen | ............... | G06F 1/181 |
| 2017/0340078 A1* | 11/2017 | Huang | ............... | A45C 11/00 |

* cited by examiner

LATCH MECHANISM CAPABLE OF UNLOCKING TWO ELECTRONIC MODULES SEPARATELY AND PORTABLE ELECTRONIC DEVICE THEREWITH

BACKGROUND OF THE INVENTION

1. Field of the Invention

The present invention relates to a latch mechanism and a portable electronic device, and more particularly to, a latch mechanism capable of unlocking two electronic modules separately and a portable electronic device therewith.

2. Description of the Prior Art

With advance of technology, performance of an electronic device is increasing, which, however, also causes high power consumption. Therefore, stable and sufficient power supply becomes a key point which determines how long the electronic device can be operated. An electronic device is usually designed to be powered by a wall socket or a battery. When the electronic device is powered by the battery, the battery cannot provide stable and sufficient electricity for a long time due to capacity thereof. Therefore, users have to shut down the electronic device for replacing the battery before the electricity of the battery runs out, which causes inconvenience in use. Furthermore, when the electronic device is powered by the wall socket, a using position of the electronic device is limited by a position of the wall socket. Therefore, the electronic device has to be used at a fixed position, which impacts on mobility.

SUMMARY OF THE INVENTION

Therefore, it is an objective of the present invention to provide a latch mechanism capable of unlocking two electronic modules separately and a portable electronic device therewith for solving the aforementioned problems.

In order to achieve the aforementioned objective, the present invention discloses a latch mechanism including a base, an operating component, a first moving component, a first pivoting component, a first latch component, a second moving component, a second pivoting component, and a second latch component. The operating component is disposed on the base in a movable manner along a first direction. The operating component is located between a first electronic module and a second electronic module. The operating component includes at least one protruding column. The first moving component is disposed on the base in a movable manner along a second direction perpendicular to the first direction. At least one first sliding slot is formed on the first moving component. The at least one protruding column passes through the at least one first sliding slot. The first pivoting component is pivotally disposed on the base and located at a side of the operating component near the first electronic module. An end of the first pivoting component is connected to the first moving component. The first latch component is connected to another end of the first pivoting component to engage with or disengage from the first electronic module. The second moving component is disposed on the base in a movable manner along the second direction. At least one second sliding slot is formed on the second moving component. The at least one protruding column passes through the at least one second sliding slot. A second pivoting component is pivotally disposed on the base and located at a side of the operating component near the second electronic module. An end of the second pivoting component is connected to the second moving component. The second latch component is connected to another end of the second pivoting component to engage with or disengage from the second electronic module. When the operating component moves relative to the base from a first position to a second position along the first direction, the first moving component is driven by cooperation of the at least one protruding column and the at least one first sliding slot to move along the second direction to pivot the first pivoting component along a first pivoting direction, so as to disengage the first latch component from the first electronic module to unlock the first electronic module. When the operating component moves relative to the base from the first position to the third position along a third direction opposite to the first direction, the second moving component is driven by cooperation of the at least one protruding column and the at least one second sliding slot to move along the second direction to pivot the second pivoting component along a second pivoting direction opposite to the first pivoting direction, so as to disengage the second latch component from the second electronic module to unlock the second electronic module.

In order to achieve the aforementioned objective, the present invention further discloses a portable electronic device including a first electronic module, a second electronic module, and a latch mechanism for unlocking the first electronic module and the second electronic module separately. The latch mechanism includes a base, an operating component, a first moving component, a first pivoting component, a first latch component, a second moving component, a second pivoting component, and a second latch component. The operating component is disposed on the base in a movable manner along a first direction. The operating component is located between the first electronic module and the second electronic module. The operating component includes at least one protruding column. The first moving component is disposed on the base in a movable manner along a second direction perpendicular to the first direction. At least one first sliding slot is formed on the first moving component. The at least one protruding column passes through the at least one first sliding slot. The first pivoting component is disposed on the base in a pivotal manner and located at a side of the operating component near the first electronic module. An end of the first pivoting component is connected to the first moving component. The first latch component is connected to another end of the first pivoting component to engage with or disengage from the first electronic module. The second moving component is disposed on the base in a movable manner along the second direction. At least one second sliding slot is formed on the second moving component. The at least one protruding column passes through the at least one second sliding slot. The second pivoting component is disposed on the base in a pivotal manner and located at a side of the operating component near the second electronic module. An end of the second pivoting component is connected to the second moving component. The second latch component is connected to another end of the second pivoting component to engage with or disengage from the second electronic module. When the operating component moves relative to the base from a first position to a second position along the first direction, the first moving component is driven by cooperation of the at least one protruding column and the at least one first sliding slot to move along the second direction to pivot the first pivoting component along a first pivoting direction, so as to disengage the first latch component from the first electronic module to unlock the first electronic module. When the operating component moves relative to the base from the first position to the third position along a third direction opposite to the first direction, the second moving component is driven by cooperation of the at least one protruding column and the at least one second sliding slot to move along the second direction to pivot the second pivoting component along a second pivoting direction opposite to the first pivoting direction, so as to disengage the second latch component from the second electronic module to unlock the second electronic module.

In summary, the latch mechanism of the present invention utilizes the cooperation of the protruding column of the operating component, the first sliding slot on the first moving component, and the second sliding slot on the second moving component for selectively driving the first moving component or the second moving component to move when the operating component moves relative to the base along different directions. When the first moving component is driven by the operating component to pivot the first pivoting component, the first pivoting component drives the first latch component to disengage from the first electronic module, so as to unlock the first electronic module. When the second moving component is driven by the operating component to pivot the second pivoting component, the second pivoting component drives the second latch to disengage from the second electronic module, so as to unlock the second electronic module. In such a way, the present invention allows users to replace the first electronic module or the second electronic module separately without interrupting operation of the portable electronic device, which brings convenience in use.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
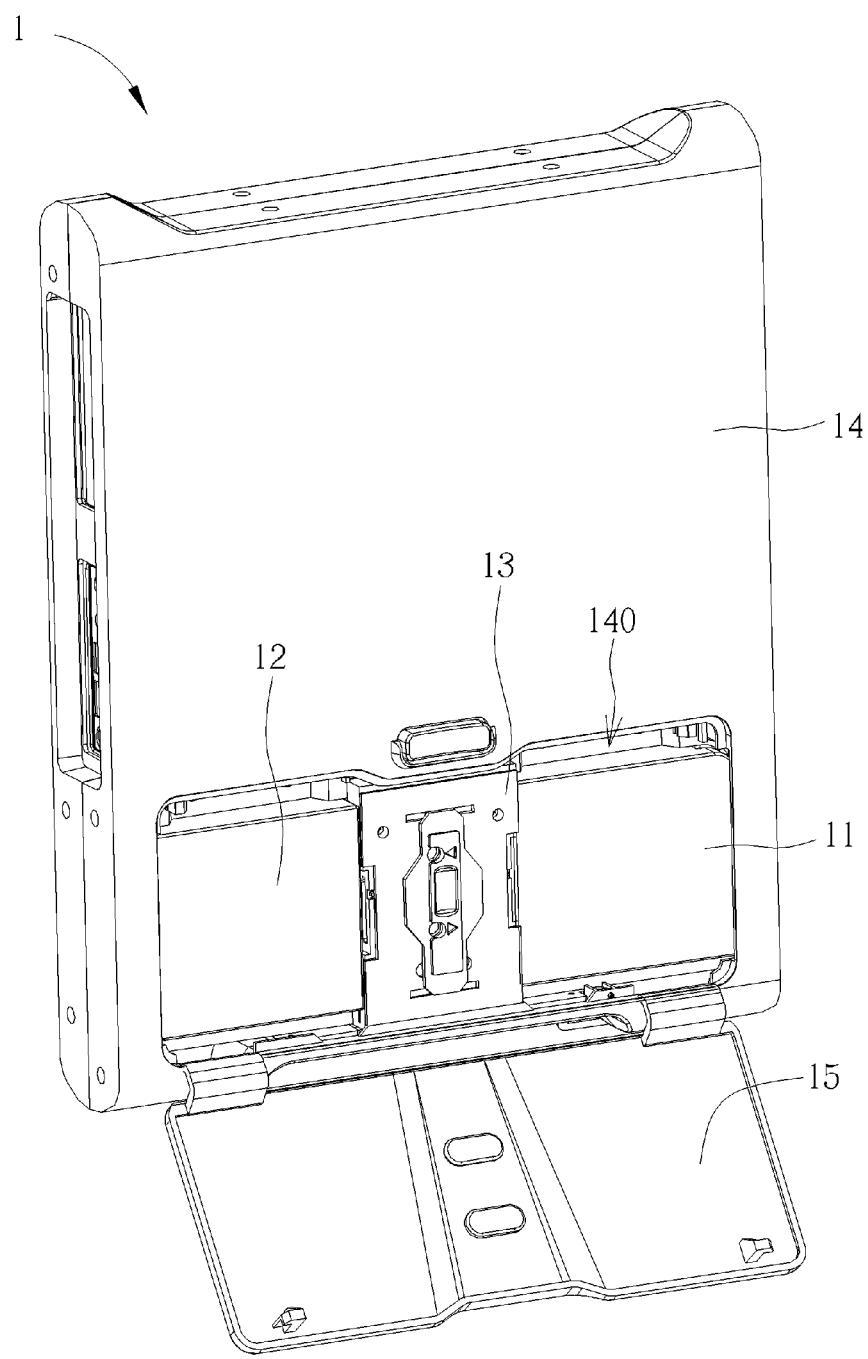
FIG. 1 is a schematic diagram of a portable electronic device according to an embodiment of the present invention.

Please refer to FIG. 1. FIG. 1 is a schematic diagram of a portable electronic device 1 according to an embodiment of the present invention. The portable electronic device 1 includes a first electronic module 11, a second electronic module 12, a latch mechanism 13, a casing 14, and a cover 15. In this embodiment, the portable electronic device 1 can be a portable computer. An accommodating space 140 is formed on the casing 14 for accommodating the first electronic module 11, the second electronic module 12, and the latch mechanism 13. The cover 15 is pivotally connected to the casing 14 and located near the accommodating space 140 for covering the first electronic module 11, the second electronic module 12, and the latch mechanism 13. In this embodiment, the first electronic module 11 and the second electronic module 12 can be two separate battery modules for providing electricity for the portable electronic device 1. The latch mechanism 13 is used for locking or unlocking the two battery modules separately to allow users to replace one of the two battery modules running out of power without interrupting operation of the portable electronic device 1, which improves endurance of the portable electronic device 1. However, the first electronic module 11, the second electronic module 12, and the latch mechanism 13 of the present invention are not limited to this embodiment. For example, in another embodiment, the first electronic module 11 and the second electronic module 12 also can be two storage modules, such as hard disc drives, for storing data of the portable electronic device 1. The latch mechanism 13 is used for locking or unlocking the two storage modules separately to allow users to replace one of the two storage modules, which brings convenience in use.

Figure 2:
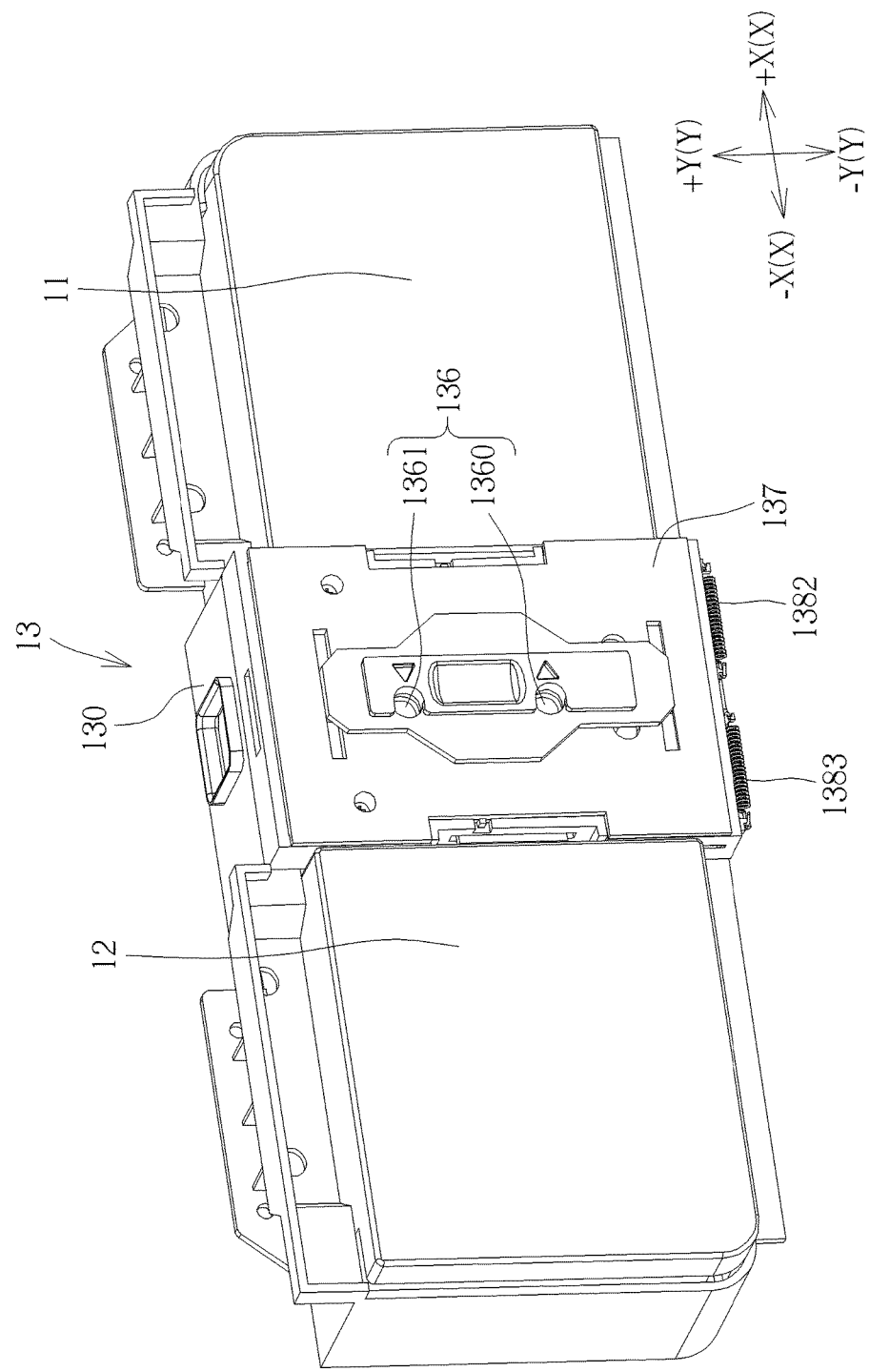
FIG. 2 is a diagram of a latch mechanism according to the embodiment of the present invention.
Figure 3:
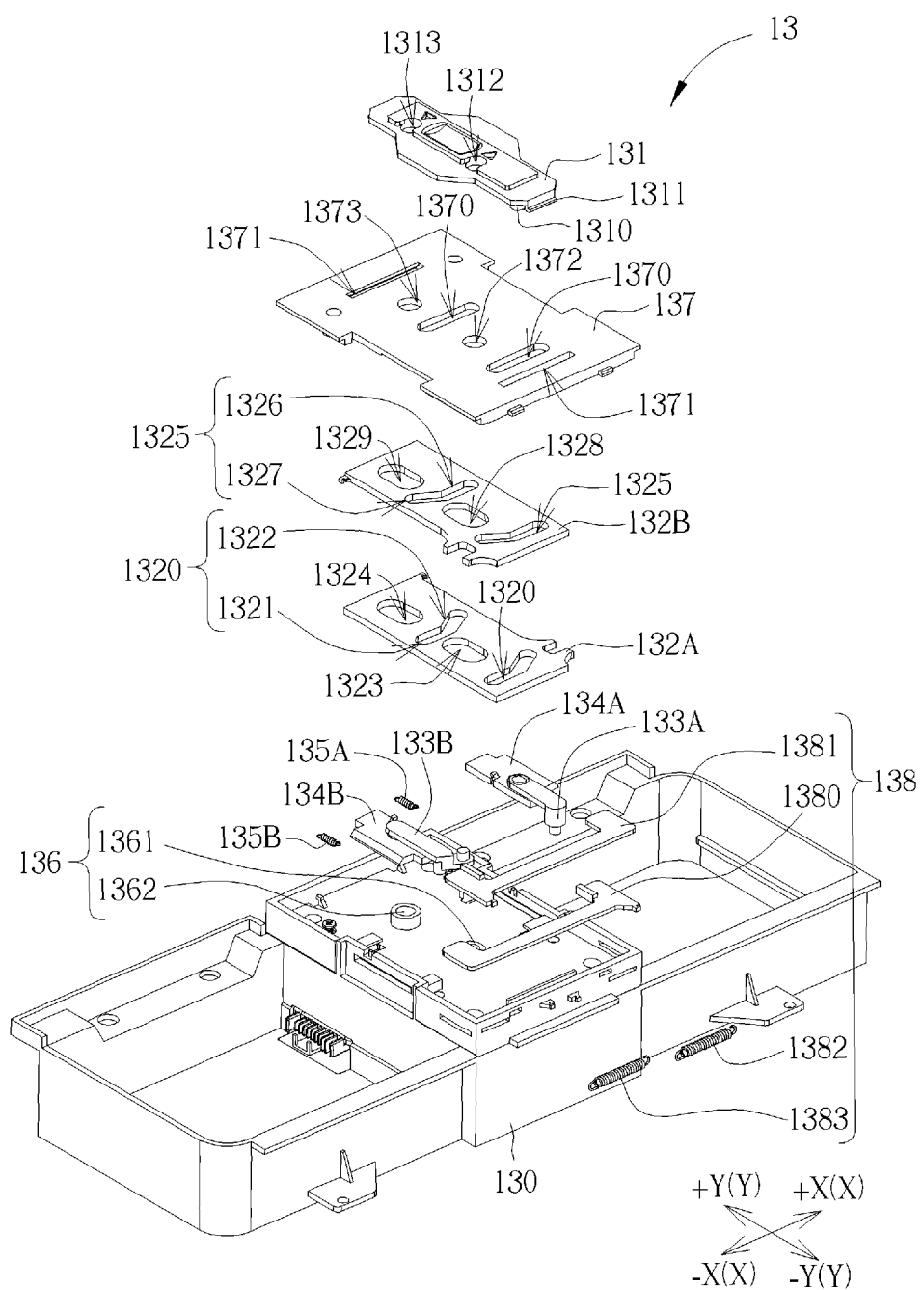
FIG. 3 and FIG. 4 are exploded diagrams of the latch mechanism at different views according to the embodiment of the present invention.
Figure 4:
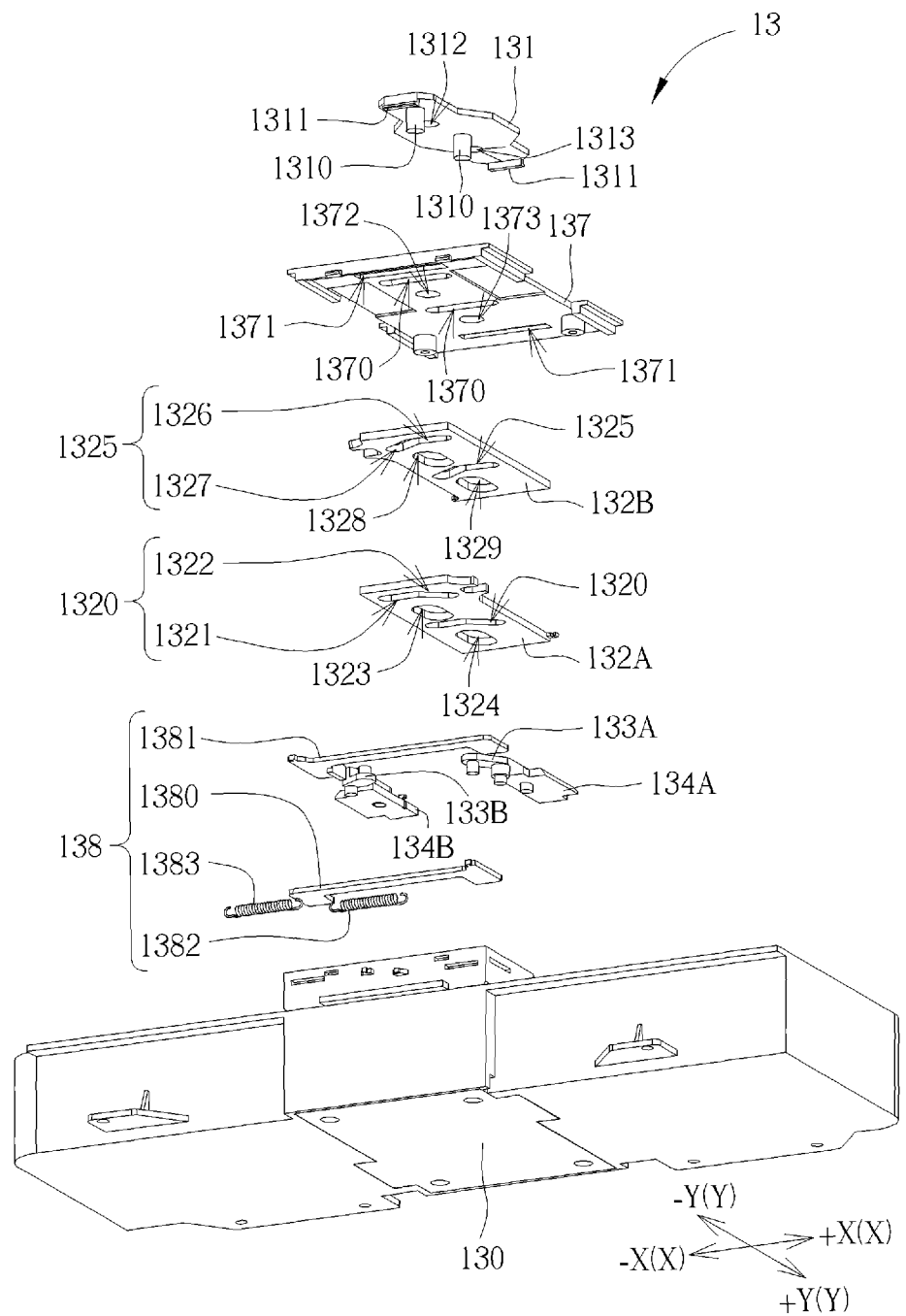

Please refer to FIG. 2 to FIG. 4. FIG. 2 is a diagram of the latch mechanism 13 according to the embodiment of the present invention. FIG. 3 and FIG. 4 are exploded diagrams of the latch mechanism 13 at different views according to the embodiment of the present invention. As shown in FIG. 1 to FIG. 4, the latch mechanism 13 includes a base 130, an operating component 131, a first moving component 132A, a second moving component 132B, a first pivoting component 133A, a second pivoting component 133B, a first latch component 134A, a second latch component 134B, a first recovering component 135A, a second recovering component 135B, a light emitting module 136, a guiding component 137, and a stopping assembly 138. The first electronic module 11 and the second electronic module 12 are installed beside the base 130 and located oppositely. The operating component 131 is disposed on the base 130 in a movable manner along a horizontal direction X and located between the first electronic module 11 and the second electronic module 12. The guiding component 137 is fixed on the base 130 and for guiding the operating component 131 to move along the horizontal direction X. The first moving component 132A and the second moving component 132B are disposed on the base 130 in a movable manner along a vertical direction Y perpendicular to the horizontal direction X. The first recovering component 135A is connected to the first moving component 132A and the base 130 to bias the first moving component 132A to recover along the vertical direction Y. The second recovering component 135B is connected to the second moving component 132B and the base 130 to bias the second moving component 132B to recover along the vertical direction Y. The horizontal direction X includes a first direction +X and a third direction −X opposite to the first direction +X. The vertical direction Y includes a second direction −Y and a fourth direction +Y opposite to the second direction −Y.

The first pivoting component 133A and the second pivoting component 133B are pivotally disposed on the base 130. The first pivoting component 133A is located at a side of the operating component 131 near the first electronic module 11. The second pivoting component 133B is located at another side of the operating component 131 near the second electronic module 12. In other words, the first pivoting component 133A and the second pivoting component 133B are located at two opposite sides of the operating component 131. Two ends of the first pivoting component 133A are respectively connected to the first moving component 132A and the first latch component 134A, so that the first pivoting component 133A can drive the first latch component 134A to engage with or disengage from the first electronic module 11 when the first moving component 132A drives the first pivoting component 133A to pivot. Two ends of the second pivoting component 133B are respectively connected to the second moving component 132B and the second latch component 134B, so that the second pivoting component 133B can drive the second latch component 134B to engage with or disengage from the second electronic module 12 when the second moving component 132B drives the second pivoting component 133B to pivot. In this embodiment, as shown in FIG. 3 and FIG. 4, the first recovering component 135A and the second recovering component 135B can be preferably two extension springs. However, the structure and the number of the recovering component are not limited to this embodiment. In other words, mechanisms which can recover the operating component 131, the first moving component 132A, the second moving component 132B, the first pivoting component 133A, and the second pivoting component 133B are within the scope of the present invention. For example, in another embodiment, the first recovering component 135A and the second recovering component 135B also can be two torsional springs sleeved on the first pivoting component 133A and the second pivoting component 133B for biasing the first pivoting component 133A and the second pivoting component 133B to recover respectively. In another embodiment, the latch mechanism 13 also can include one recovering component connected to the operating component 131 and the base 130 for biasing the operating component 131 to recover.

Furthermore, the stopping assembly 138 includes a first stopping component 1380, a second stopping component 1381, a first resilient component 1382, and a second resilient component 1383. The first stopping component 1380 is disposed on the base 130 in a movable manner along the horizontal direction X and for selectively abutting against the second electronic module 12 or the first moving component 132A. The second stopping component 1381 is disposed on the base 130 in a movable manner along the horizontal direction X and for selectively abutting against the first electronic module 11 or the second moving component 132B. The first resilient component 1382 is connected to the base 130 and the first stopping component 1380 for providing a resilient force for biasing the first stopping component 1380 to abut against the first moving component 132A. The second resilient component 1383 is connected to the base 130 and the second stopping component 1381 for providing a resilient force for biasing the second stopping component 1381 to abut against the second moving component 132B. However, the structure of the stopping assembly 138 is not limited to that illustrated in the figures of this embodiment. In other words, mechanisms which can bias the first stopping component 1380 and the second stopping component 1381 to abut against the first moving component 132A and the second moving component 132B respectively are within the scope of the present invention. For example, in another embodiment, the stopping assembly 138 also can include one resilient component disposed between the first stopping component 1380 and the second stopping component 1381 for biasing the first stopping component 1380 and the second stopping component 1381 to abut against the first moving component 132A and the second moving component 132B respectively.

Figure 5:
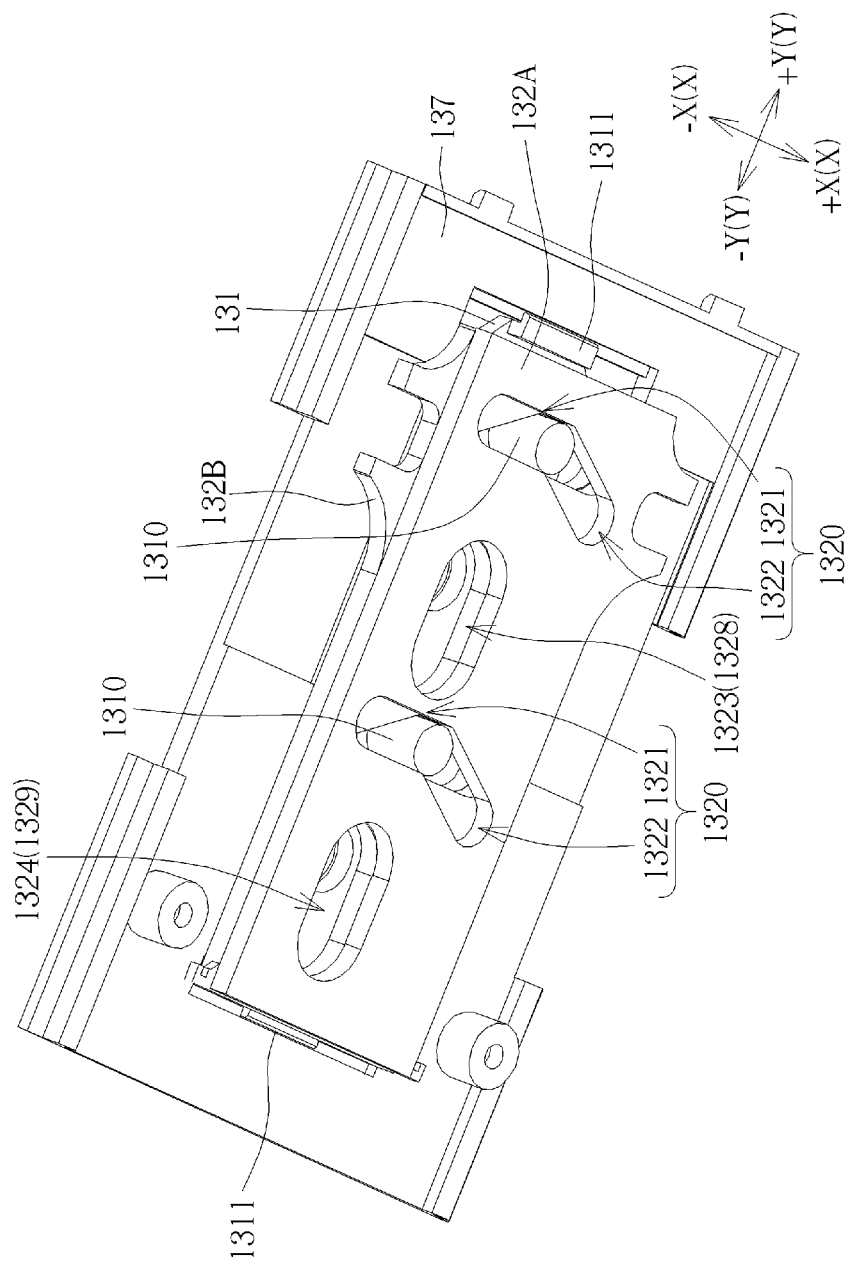
FIG. 5 is an assembling diagram of an operating component, a guiding component, a first moving component, and a second moving component according to the embodiment of the present invention.

Please refer to FIG. 5. FIG. 5 is an assembling diagram of the operating component 131, the guiding component 137, the first moving component 132A, and the second moving component 132B according to the embodiment of the present invention. As shown in FIG. 3 to FIG. 5, in this embodiment, the operating component 131, the guiding component 137, the second moving component 132B, and the first moving component 132A are stacked from top to bottom. The operating component 131 includes two protruding columns 1310 and two step-shaped guiding structures 1311. Two first guiding slots 1370 and two second guiding slots 1371 are formed on the guiding component 137. Two first sliding slots 1320 are formed on the first moving component 132A. Two second sliding slots 1325 are formed on the second moving component 132B. Each of the two protruding columns 1310 passes through the corresponding first guiding slot 1370, the corresponding second sliding slot 1325, and the corresponding first sliding slot 1320 sequentially. Each of the two step-shaped guiding structures 1311 passes through the corresponding second guiding slot 1371. However, the structures and the configurations of the operating component 131, the guiding component 137, the second moving component 132B, and the first moving component 132A are not limited to this embodiment. It depends on practical demands.

In this embodiment, the two first guiding slots 1370 and the two second guiding slots 1371 can be preferably parallel to the horizontal direction X substantially. When the operating component 131 is operated to move along the horizontal direction X, the two protruding columns 1310 and the two step-shaped guiding structures 1311 cooperate with the two first guiding slots 1370 and the two second guiding slots 1371 respectively to prevent a moving direction of the operating component 131 from deviating from the horizontal direction X. Each of the two first sliding slots 1320 includes a first section 1321 and a second section 1322. The first section 1321 is substantially parallel to the horizontal direction X. The second section 1322 extends toward the vertical direction Y and is connected to the first section 1321. Therefore, each of the two first sliding slots 1320 is substantially formed in a V shape, and an included angle between the first section 1321 and the second section 1322 of each of the two first sliding slots 1320 is greater than 90 degrees. Similarly, each of the two second sliding slots 1325 includes a third section 1326 and a fourth section 1327. The third section 1326 is substantially parallel to the horizontal direction X. The fourth section 1327 extends toward the vertical direction Y and is connected to the third section 1326. Therefore, each of the two second sliding slots 1325 is substantially formed in a V shape, and an included angle between the third section 1326 and the fourth section 1327 of each of the two second sliding slots 1325 is greater than 90 degrees. Furthermore, a turning joint of the first section 1321 and the second section 1322 of each of the two first sliding slots 1320 substantially coincides with a turning joint of the third section 1326 and the fourth section 1327 of each of the two second sliding slots 1325.

When each of the two protruding columns 1310 passes through the turning joint of the first section 1321 and the second section 1322 of the corresponding first sliding slot 1320 and the turning joint of the third section 1326 and the fourth section 1327 of the corresponding second sliding slot 1325, each of the two first sliding slots 1320 is axially symmetrical to the corresponding second sliding slot 1325 relative to the corresponding protruding column 1310. In such a way, when the operating component 131 moves along the horizontal direction X, each of the two protruding columns 1310 can cooperate with the corresponding first sliding slot 1320 and the corresponding second sliding slot 1325, so as to selectively drive the first moving component 132A or the second moving component 132B to move along the vertical direction Y. However, the structures of the first guiding slot 1370, the second guiding slot 1371, the first sliding slot 1320, and the second sliding slot 1325 are not limited to those illustrated in figures of this embodiment. It depends on practical demands.

Figure 6:
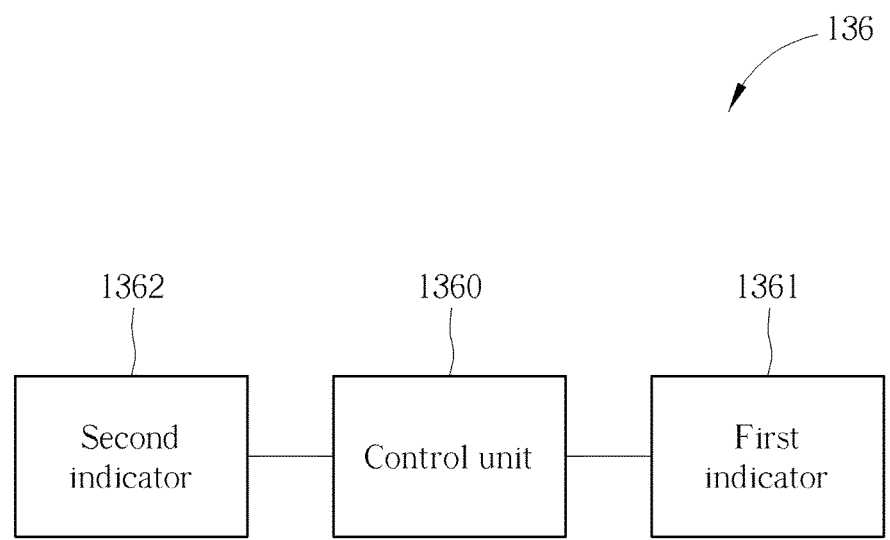
FIG. 6 is a functional block diagram of a light emitting module according to the embodiment of the present invention.

Please refer to FIG. 6. FIG. 6 is a functional block diagram of the light emitting module 136 according to the embodiment of the present invention. As shown in FIG. 1, FIG. 3, and FIG. 6, in this embodiment, the light emitting module 136 includes a control unit 1360, a first indicator 1361, and a second indicator 1362. In this embodiment, the control unit 1360 can be a microprocessor, and the first indicator 1361 and the second indicator 1362 can be two light emitting diodes. However, it is not limited thereto. The first indicator 1361 and the second indicator 1362 are installed on the base 130 and electrically connected to the control unit 1360. The control unit 1360 turns on the first indicator 1361 when the first latch component 134A disengages from the first electronic module 11, and further turns on the second indicator 1362 when the second latch component 134B disengages from the second electronic module 12. Furthermore, a first avoiding slot 1323 and a second avoiding slot 1324 are formed on the first moving component 132A. The first avoiding slot 1323 and the second avoiding slot 1324 are parallel to the vertical direction Y. The first avoiding slot 1323 and the second avoiding slot 1324 are respectively located at positions corresponding to the first indicator 1361 and the second indicator 1362 to reveal the first indicator 1361 and the second indicator 1362, so as to prevent the first moving component 132A from interfering with the first indicator 1361 and the second indicator 1362.

Similarly, a third avoiding slot 1328 and a fourth avoiding slot 1329 are formed on the second moving component 132B. The third avoiding slot 1328 and the fourth avoiding slot 1329 are parallel to the vertical direction Y and respectively located at positions corresponding to the first indicator 1361 and the second indicator 1362 to reveal the first indicator 1361 and the second indicator 1362, so as to prevent the second moving component 132B from interfering with the first indicator 1361 and the second indicator 1362. Furthermore, as shown in FIG. 3, a first through hole 1372 and a second through hole 1373 are formed on the guiding component 137 and corresponding to the first indicator 1361 and the second indicator 1362. A first observation hole 1312 and a second observation hole 1313 are formed on the operating component 131 and corresponding to the first indicator 1361 and the second indicator 1362. In such a way, users can observe the first indicator 1361 through the first observation hole 1312, the first through hole 1372, the third avoiding slot 1328, and the first avoiding slot 1323, and observe the second indicator 1362 through the second observation hole 1313, the second through hole 1373, the fourth avoiding slot 1329, and the second avoiding slot 1324.

Figure 7:
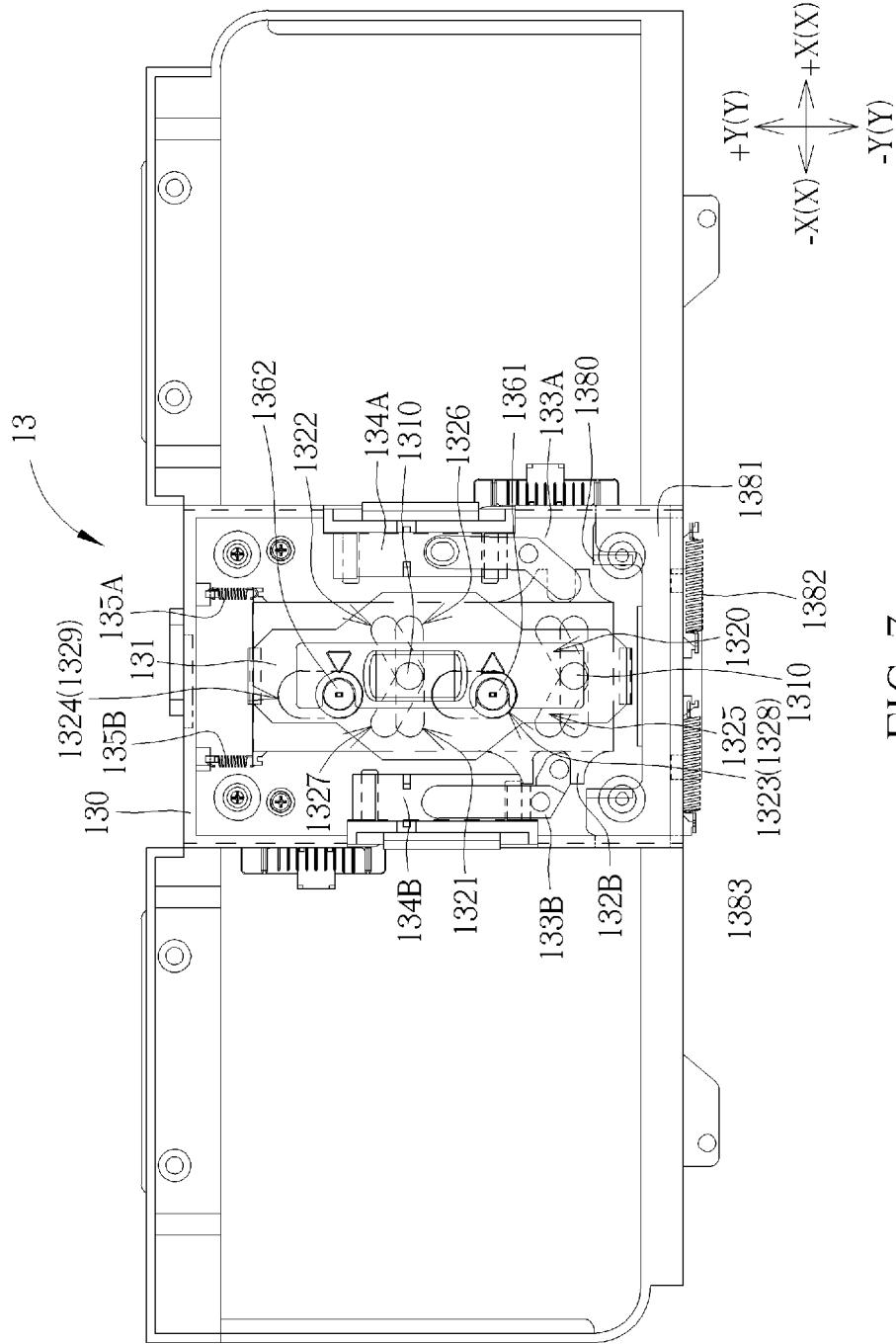
FIG. 7 is an internal structural diagram of the latch mechanism shown in FIG. 2 according to the embodiment of the present invention.
Figure 8:
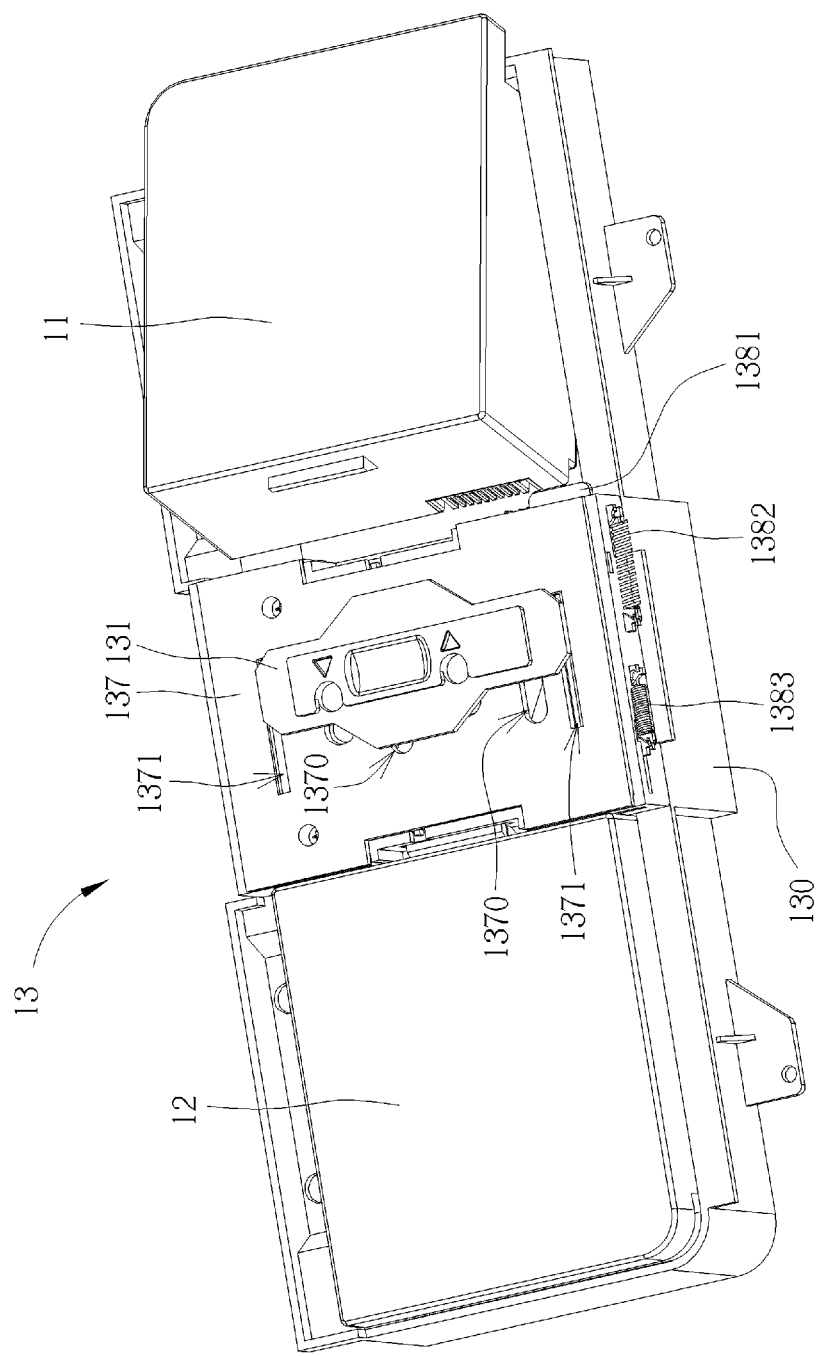
FIG. 8 is a diagram of the latch mechanism as a first electronic module and a first latch component are disengaged from each other according to the embodiment of the present invention.
Figure 9:
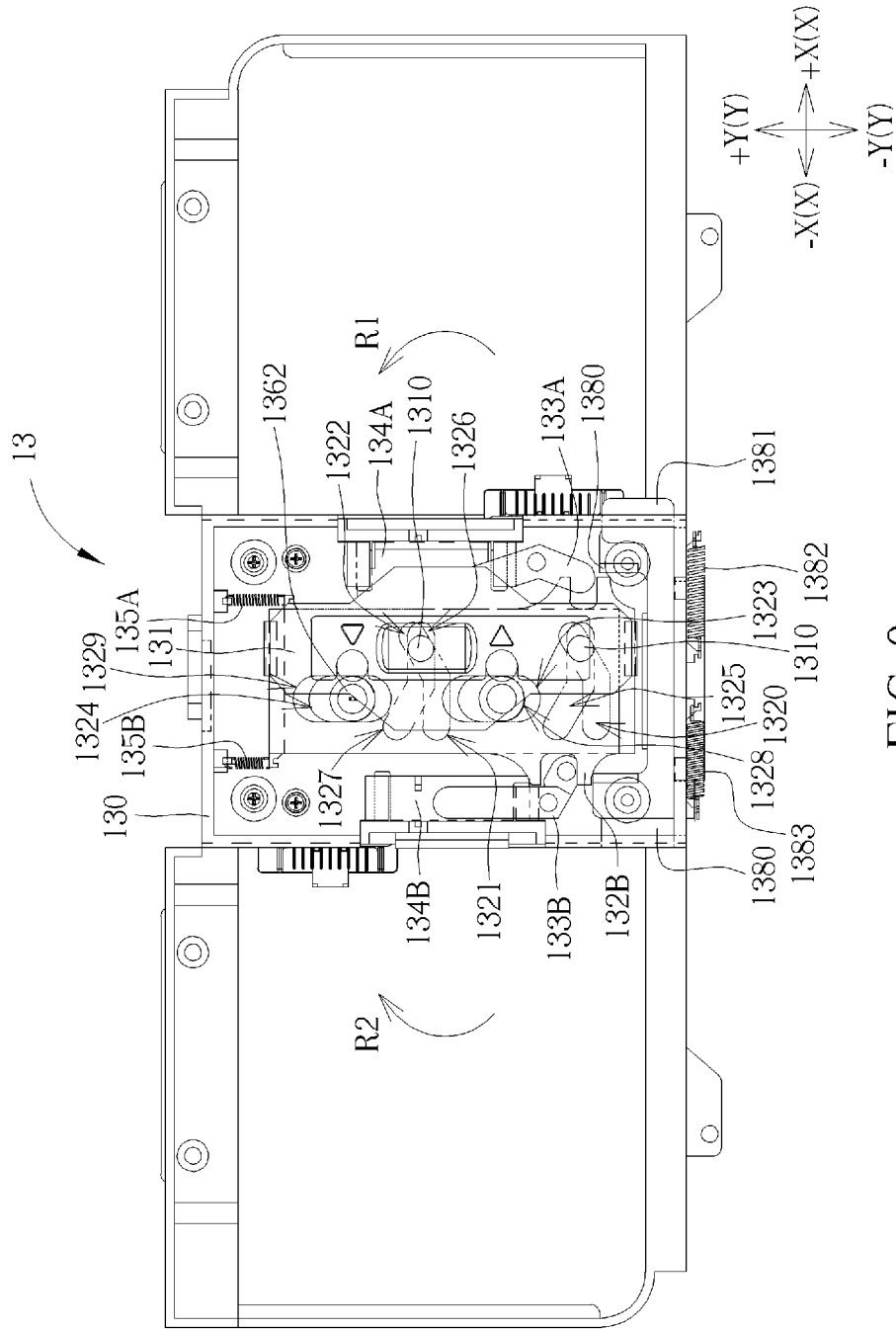
FIG. 9 is an internal structural diagram of the latch mechanism shown in FIG. 8 according to the embodiment of the present invention.
Figure 10:
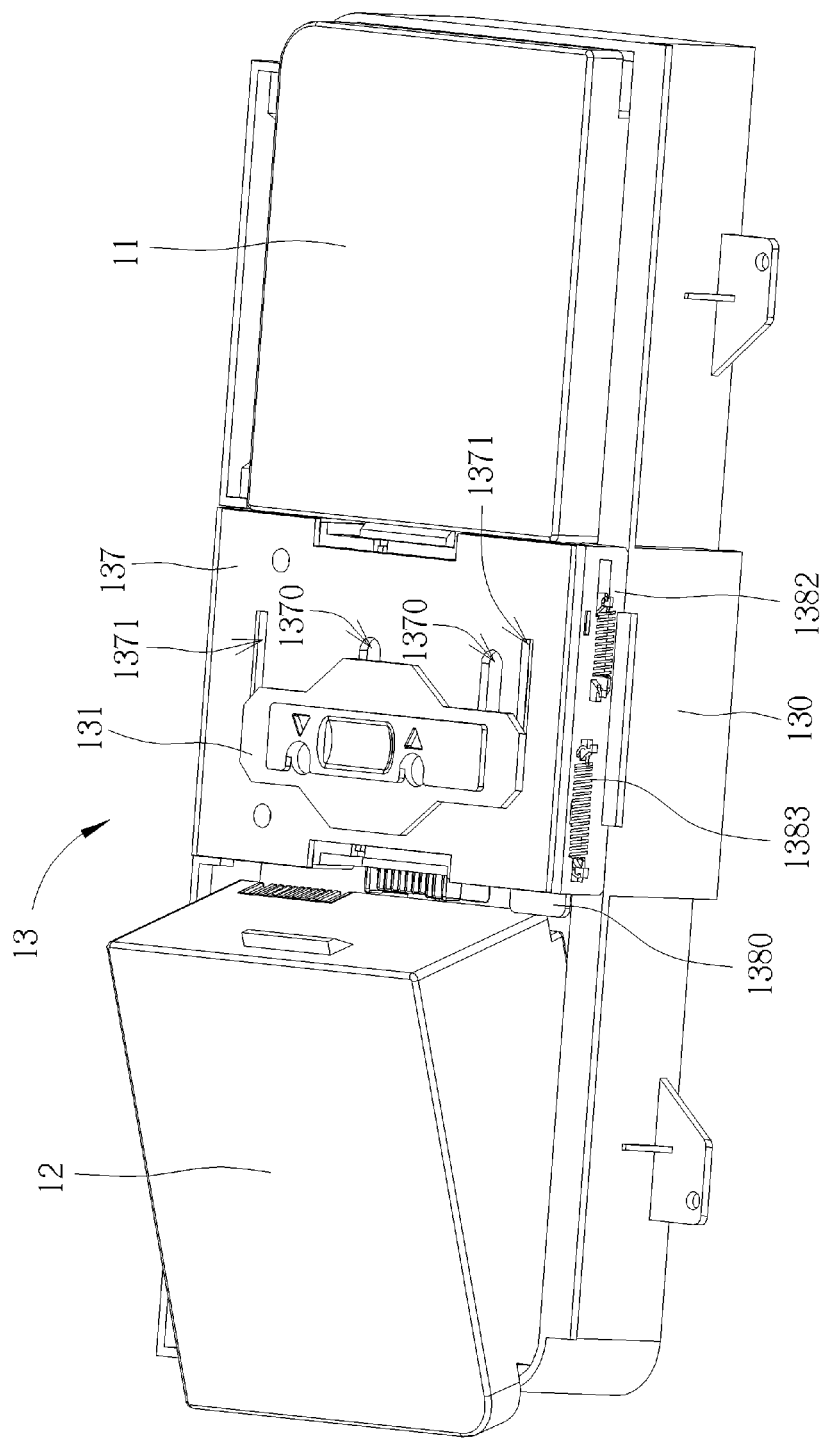
FIG. 10 is a diagram of the latch mechanism as a second electronic module and a second latch component are disengaged from each other according to the embodiment of the present invention.
Figure 11:
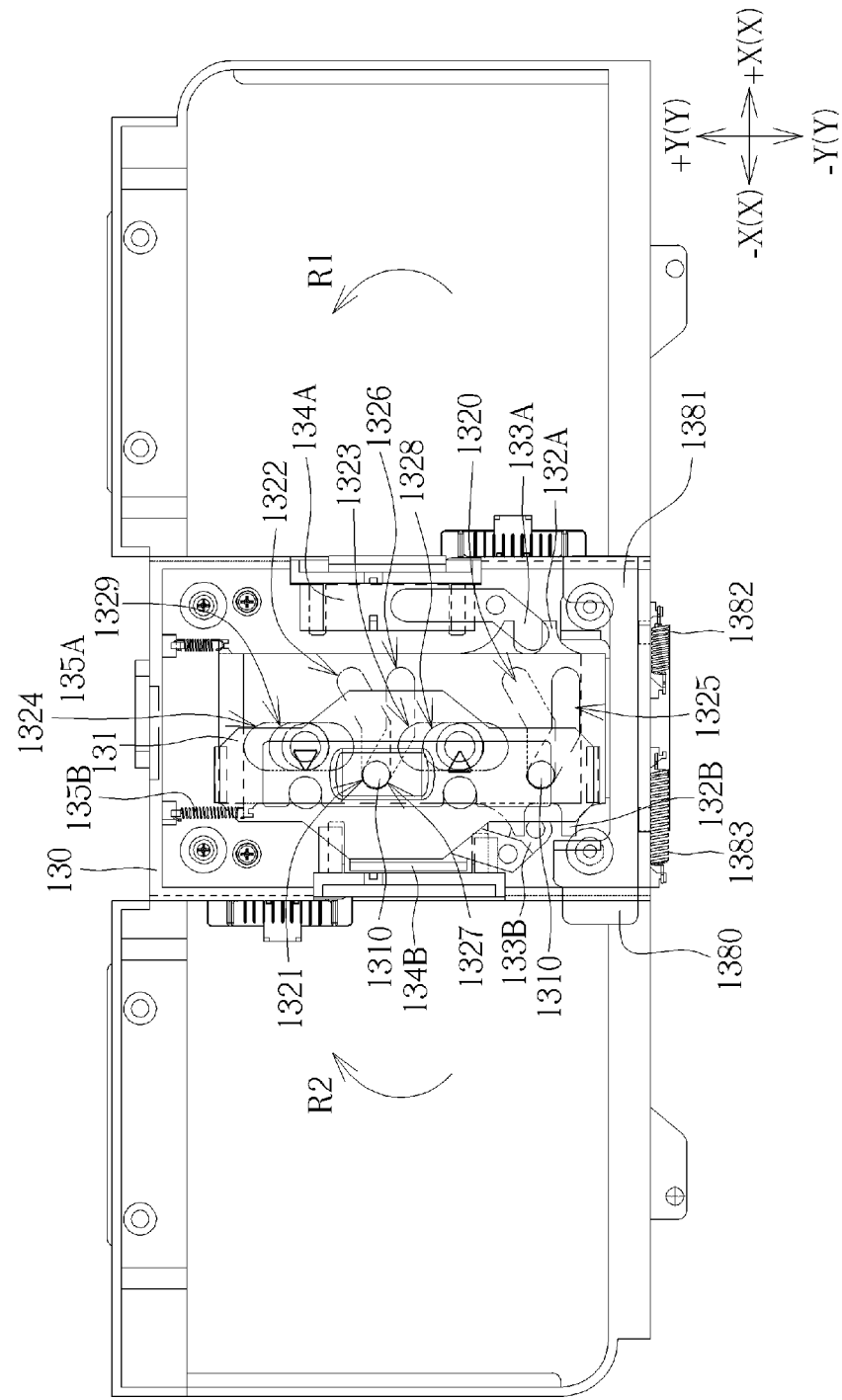
FIG. 11 is an internal structural diagram of the latch mechanism shown in FIG. 10 according to the embodiment of the present invention.
Figure 12:
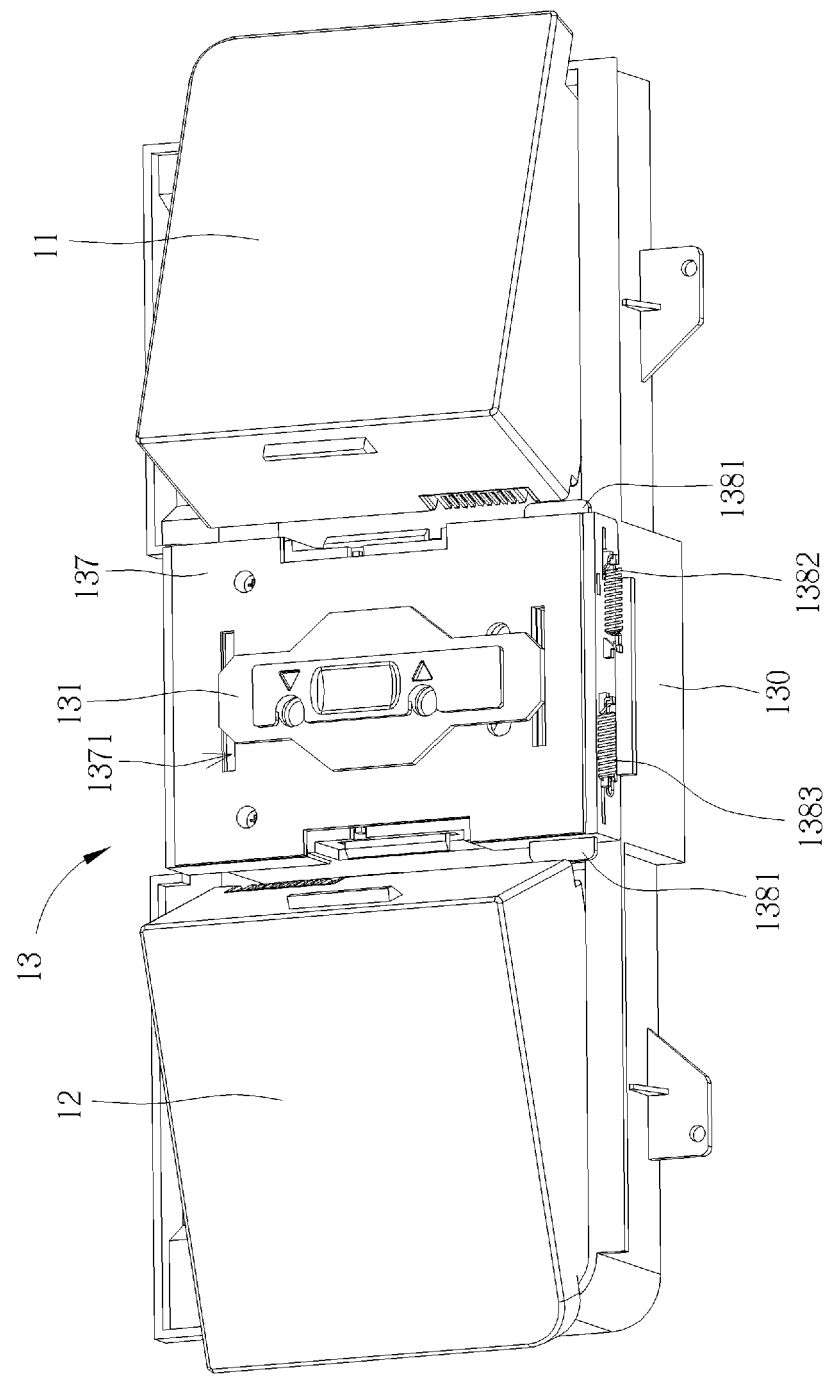
FIG. 12 is a schematic diagram of the latch mechanism as the first latch component and the second latch component disengage from the first electronic module and the second electronic module respectively according to the embodiment of the present invention.

Please refer to FIG. 7 to FIG. 12. FIG. 7 is an internal structural diagram of the latch mechanism 13 shown in FIG. 2 according to the embodiment of the present invention. FIG. 8 is a diagram of the latch mechanism 13 as the first electronic module 11 and the first latch component 134A are disengaged from each other according to the embodiment of the present invention. FIG. 9 is an internal structural diagram of the latch mechanism 13 shown in FIG. 8 according to the embodiment of the present invention. FIG. 10 is a diagram of the latch mechanism 13 as the second electronic module 12 and the second latch component 134B are disengaged from each other according to the embodiment of the present invention. FIG. 11 is an internal structural diagram of the latch mechanism 13 shown in FIG. 10 according to the embodiment of the present invention. FIG. 12 is a schematic diagram of the latch mechanism 13 as the first latch component 134A and the second latch component 134B disengage from the first electronic module 11 and the second electronic module 12 respectively according to the embodiment of the present invention. When the operating component 131 is located at a first position, as shown in FIG. 7, relative to the base 130, each of the two protruding columns 1310 passes through the turning joint of the first section 1321 and the second section 1322 of the corresponding first sliding slot 1320 and the turning joint of the third section 1326 and the fourth section 1327 of the corresponding second sliding slot 1325. At this moment, the first latch component 134A and the second latch component 134B engage with the first electronic module 11 and the second electronic module 12 respectively. Therefore, the first electronic module 11 and the second electronic module 12 are fixed beside the base 130.

When it is desired to detach the first electronic module 11 from an installing position as shown in FIG. 2, the operating component 131 can be operated to move relative to the base 130 from the first position as shown in FIG. 7 to a second position as shown in FIG. 9, along the first direction +X, so that the two protruding columns 1310 and the two step-shaped guiding structures 1311 cooperate with the two first guiding slots 1370 and the two second guiding slots 1371 respectively, which ensures that the moving direction of the operating component 131 is parallel to the first direction +X. At this moment, each of the two protruding columns 1310 cooperates with the second section 1322 of the corresponding first sliding slot 1320 and the third section 1326 of the corresponding second sliding slot 1325. Therefore, the first moving component 132A is driven to move along the second direction −Y by cooperation of each of the two protruding columns 1310 and an inclined surface of the second section 1322 of the corresponding first sliding slot 1320. However, the second moving component 132B is not driven to move when each of the two protruding columns 1310 slides within the third section 1326 of the corresponding second sliding slot 1325 because the third section 1326 of each of the two second sliding slots 1325 is parallel to the moving direction of the operating component 131, i.e., the first direction +X. During a process that the first moving component 132A moves along the second direction −Y, the first pivoting component 133A is driven by the first moving component 132A to pivot relative to the base 130 along a first pivoting direction R1, so that the first latch component 134A connected to the another end of the first pivoting component 133A is driven to disengage from the first electronic module 11.

Furthermore, when the first moving component 132A moves along the second direction −Y, the first avoiding slot 1323 and the second avoiding slot 1324 cooperate with the first indicator 1361 and the second indicator 1362 respectively for preventing the first moving component 132A from interfering with the first indicator 1361 and the second indicator 1362. When the first latch component 134A disengages from the first electronic module 11, the control unit 1360 turns on the first indicator 1361 correspondingly. When users observe light emitted from the first indicator 1361 through the first observation hole 1312, the first through hole 1372, the third avoiding slot 1328, and the first avoiding slot 1323, users can be aware that the first electronic module 11 is ready to be detached easily. As shown in FIG. 8, when the first electronic module 11 is detached, the operating component 131 can be released to allow the first recovering component 135A to drive the first moving component 132A to recover along the fourth direction +Y, so as to drive the operating component 131 to recover from the second position as shown in FIG. 9 to the first position as shown in FIG. 7, along the third direction −X.

On the other hand, when it is desired to detach the second electronic module 12 from an installing position as shown in FIG. 2, the operating component 131 can be operated to move relative to the base 130 from the first position as shown in FIG. 7 to a third position as shown in FIG. 11, along the third direction −X, so that the two protruding columns 1310 and the two step-shaped guiding structures 1311 of the operating component 131 cooperate with the two first guiding slots 1370 and the two second guiding slots 1371 of the guiding component 137, which ensures that the moving direction of the operating component 131 is parallel to the third direction −X. At this moment, each of the two protruding columns 1310 of the operating component 131 cooperates with the first section 1321 of the corresponding first sliding slot 1320 and the fourth section 1327 of the corresponding second sliding slot 1325. Therefore, the second moving component 132B is driven to move along the second direction −Y by cooperation of each of the two protruding columns 1310 and an inclined surface of the fourth section 1327 of the corresponding second sliding slot 1325. However, the first moving component 132A is not driven to move when each of the two protruding columns 1310 slides within the first section 1321 of the corresponding first sliding slot 1320 because the first section 1321 of each of the two first sliding slots 1320 is parallel to the moving direction of the operating component 131, i.e., the third direction −X. During a process that the second moving component 132B moves along the second direction −Y, the second pivoting component 133B is driven by the second moving component 132B to pivot relative to the base 130 along a second pivoting direction R2 opposite to the first pivoting direction R1, so that the second latch component 134B connected to the another end of the second pivoting component 133B is driven to disengage from the second electronic module 12.

Furthermore, when the second moving component 132B moves along the second direction −Y, the third avoiding slot 1328 and the fourth avoiding slot 1329 cooperate with the first indicator 1361 and the second indicator 1362 respectively for preventing the second moving component 132B from interfering with the first indicator 1361 and the second indicator 1362. When the second latch component 134B disengages from the second electronic module 12, the control unit 1360 turns on the second indicator 1362 correspondingly. When users observe light emitted from the second indicator 1362 through the second observation hole 1313, the second through hole 1373, the fourth avoiding slot 1329, and the second avoiding slot 1324, users can be aware of that the second electronic module 12 is ready to be detached easily. As shown in FIG. 10, when the second electronic module 12 is detached, the operating component 131 can be released to allow the second recovering component 135B to drive the second moving component 132B to recover along the fourth direction +Y, so as to drive the operating component 131 to recover from the third position as shown in FIG. 11 to the first position as shown in FIG. 7, along the first direction +X.

It should be noticed that, as shown in FIG. 8 and FIG. 9, when the first electronic module 11 is detached, the second stopping component 1381 is not abutted by the first electronic module 11 anymore. The second resilient component 1383 drives the second stopping component 1381 to move along the first direction +X to protrude from the base 130 until the second stopping component 1381 abuts against the second moving component 132B, so that the second moving component 132B is stopped from moving along the second direction −Y, which restrains the operating component 131 from moving to the third position, as shown in FIG. 11, along the third direction −X. Therefore, the aforementioned mechanism can prevent the second electronic module 12 from falling off intentionally due to operational mistake of the operating component 131 when the first electronic module 11 has been detached, which ensures that the portable electronic device 1 can be operated continuously with at least one electronic module, such as at least one battery module, without any interruption. However, when it is desired to detach both of the first electronic module 11 and the second electronic module 12 after detachment of the first electronic module 11, the second stopping component 1381 protruding from the base 130 along the first direction +X has to be pushed manually to move along the third direction −X until the second stopping component 1381 departs from the second moving component 132B, which allows the second moving component 132B to move along the second direction −Y. For example, the second stopping component 1381 can be pushed to depart from the second moving component 132B and move to a position, as shown in FIG. 7. In such a way, the operating component 131 can be operated to move to the third position along the third direction −X to drive the second latch component 134B to disengage from the second electronic module 12 by the second moving component 132B and the second pivoting component 133B, so as to detach the second electronic module 12, as shown in FIG. 12.

Similarly, as shown in FIG. 10 and FIG. 11, when the second electronic module 12 is detached, the first stopping component 1380 is not abutted by the second electronic module 12 anymore. The first resilient component 1382 drives the first stopping component 1380 to move along the third direction −X to protrude from the base 130 until the first stopping component 1380 abuts against the first moving component 132A, so that the first moving component 132A is stopped from moving along the second direction −Y, which restrains the operating component 131 from moving to the second position as shown in FIG. 9 along the first direction +X. Therefore, the aforementioned mechanism can prevent the first electronic module 11 from falling off intentionally due to operational mistake of the operating component 131 when the second electronic module 12 has been detached, which ensures that the portable electronic device 1 can be operated continuously with at least one electronic module, such as at least one battery module, without any interruption. However, when it is desired to detach both of the first electronic module 11 and the second electronic module 12 after detachment of the second electronic module 12, the first stopping component 1380 protruding from the base 130 along the third direction −X has to be pushed manually to move along the first direction +X until the first stopping component 1380 departs from the first moving component 132A, which allows the first moving component 132A to move along the second direction −Y. For example, the first stopping component 1380 can be pushed to depart from the first moving component 132A and move to a position, as shown in FIG. 7. In such a way, the operating component 131 can be operated to move to the second position along the first direction +X to drive the first latch component 134A to disengage from the first electronic module 11 by the first moving component 132A and the first pivoting component 133A, so as to detach the first electronic module 11, as shown in FIG. 12.

In contrast to the prior art, the latch mechanism of the present invention utilizes the cooperation of the protruding column of the operating component, the first sliding slot on the first moving component, and the second sliding slot on the second moving component for selectively driving the first moving component or the second moving component to move when the operating component moves relative to the base along different directions. When the first moving component is driven by the operating component to pivot the first pivoting component, the first pivoting component drives the first latch component to disengage from the first electronic module, so as to unlock the first electronic module. When the second moving component is driven by the operating component to pivot the second pivoting component, the second pivoting component drives the second latch to disengage from the second electronic module, so as to unlock the second electronic module. In such a way, the present invention allows users to replace the first electronic module or the second electronic module separately without interrupting operation of the portable electronic device, which brings convenience in use. Furthermore, the latch mechanism of the present invention utilizes the stopping assembly for selectively stopping the first moving component or the second moving component, so that the first electronic module and the second electronic module can be prevented from being detached at the same time due to operational mistake of the operating component, which ensures that the portable electronic device can be operated continuously without any interruption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A latch mechanism comprising:
   a base;
   an operating component disposed on the base in a movable manner along a first direction, the operating component being located between a first electronic module and a second electronic module, the operating component comprising at least one protruding column;
   a first moving component disposed on the base in a movable manner along a second direction perpendicular to the first direction, at least one first sliding slot being formed on the first moving component, the at least one protruding column passing through the at least one first sliding slot;
   a first pivoting component pivotally disposed on the base and located at a side of the operating component near the first electronic module, an end of the first pivoting component being connected to the first moving component;
   a first latch component connected to another end of the first pivoting component to engage with or disengage from the first electronic module;
   a second moving component disposed on the base in a movable manner along the second direction, at least one second sliding slot being formed on the second moving component, the at least one protruding column passing through the at least one second sliding slot;
   a second pivoting component pivotally disposed on the base and located at a side of the operating component near the second electronic module, an end of the second pivoting component being connected to the second moving component; and
   a second latch component connected to another end of the second pivoting component to engage with or disengage from the second electronic module;
   wherein when the operating component moves relative to the base from a first position to a second position along the first direction, the first moving component is driven by cooperation of the at least one protruding column and the at least one first sliding slot to move along the second direction to pivot the first pivoting component along a first pivoting direction, so as to disengage the first latch component from the first electronic module to unlock the first electronic module, and when the operating component moves relative to the base from the first position to the third position along a third direction opposite to the first direction, the second moving component is driven by cooperation of the at least one protruding column and the at least one second sliding slot to move along the second direction to pivot the second pivoting component along a second pivoting direction opposite to the first pivoting direction, so as to disengage the second latch component from the second electronic module to unlock the second electronic module.

2. The latch mechanism of claim 1, wherein the at least one first sliding slot comprises a first section and a second section, the first section is substantially parallel to the first direction, the second section extends toward the second direction, the at least one second sliding slot comprises a third section and a fourth section, the third section is substantially parallel to the first direction, and the fourth section extends toward the second direction.

3. The latch mechanism of claim 2, wherein the at least one first sliding slot and the at least one second sliding slot are formed in V shapes and axially symmetrical to each other, a turning joint of the first section and the second section of the at least one first sliding slot substantially coincides with a turning joint of the third section and the fourth section of the at least one second sliding slot, and the at least one protruding column passes through the turning joint of the first section and the second section and the turning joint of the third section and the fourth section when the operating component is located at the first position relative to the base.

4. The latch mechanism of claim 2, wherein an included angle between the first section and the second section and an included angle between the third section and the fourth section are greater than 90 degrees.

5. The latch mechanism of claim 1, further comprising a first recovering component and a second recovering component, the first recovering component being connected to the first moving component and the base to bias the first moving component to recover along a fourth direction opposite to the second direction, and the second recovering component being connected to the second moving component and the base to bias the second moving component to recover along the fourth direction.

6. The latch mechanism of claim 1, further comprising a light emitting module comprising a first indicator, a second indicator and a control unit, the first indicator and the second indicator being electrically connected to the control unit, the control unit turning on the first indicator when the first latch component disengages from the first electronic module, and the control unit further turning on the second indicator when the second latch component disengages from the second electronic module.

7. The latch mechanism of claim 6, wherein the first indicator and the second indicator are installed on the base, a first avoiding slot and a second avoiding slot are formed on the first moving component along the second direction and respectively located at positions corresponding to the first indicator and the second indicator to reveal the first indicator and the second indicator, so as to prevent the first moving component from interfering with the first indicator and the second indicator, and a third avoiding slot and a fourth avoiding slot are formed on the second moving component along the second direction and respectively located at positions corresponding to the first indicator and the second indicator to reveal the first indicator and the second indicator, so as to prevent the second moving component from interfering with the first indicator and the second indicator.

8. The latch mechanism of claim 1, further comprising a stopping assembly comprising a first stopping component and a second stopping component, the first stopping component and the second stopping component being disposed on the base and movable along the first direction and the third direction respectively, the first stopping component selectively abutting against the second electronic module or the first moving component to allow or restrain a displacement of the first moving component along the second direction, and the second stopping component selectively abutting against the first electronic module or the second moving component to allow or restrain a displacement of the second moving component along the second direction.

9. The latch mechanism of claim 8, wherein the second electronic module pushes the first stopping component to depart from the first moving component when the second electronic module is installed beside the base, and the first electronic module pushes the second stopping component to depart from the second moving component when the first electronic module is installed beside the base.

10. The latch mechanism of claim 8, wherein the stopping assembly further comprises a first resilient component and a second resilient component, the first resilient component is connected to the base and the first stopping component to drive the first stopping component to abut against the first moving component to restrain the displacement of the first moving component along the second direction when the second electronic module is not installed beside the base, and the second resilient component is connected to the base and the second stopping component to drive the second stopping component to abut against the second moving component to restrain the displacement of the second moving component along the second direction when the first electronic module is not installed beside the base.

11. The latch mechanism of claim 1, further comprising a guiding component, at least one first guiding slot and at least one second guiding slot being formed on the guiding component, the operating component further comprising at least one step-shaped guiding structure, and the at least one protruding column and the at least one step-shaped guiding structure passing through the at least one first guiding slot and the at least one second guiding slot respectively, so as to guide the operating component to move along the first direction or the third direction.

12. A portable electronic device comprising:
a first electronic module;
a second electronic module; and
a latch mechanism to unlock the first electronic module and the second electronic module separately, the latch mechanism comprising:
a base;
an operating component disposed on the base in a movable manner along a first direction, the operating component being located between the first electronic module and the second electronic module, the operating component comprising at least one protruding column;
a first moving component disposed on the base in a movable manner along a second direction perpendicular to the first direction, at least one first sliding slot being formed on the first moving component, the at least one protruding column passing through the at least one first sliding slot;
a first pivoting component disposed on the base in a pivotal manner and located at a side of the operating component near the first electronic module, an end of the first pivoting component being connected to the first moving component;
a first latch component connected to another end of the first pivoting component to engage with or disengage from the first electronic module;
a second moving component disposed on the base in a movable manner along the second direction, at least one second sliding slot being formed on the second moving component, the at least one protruding column passing through the at least one second sliding slot;
a second pivoting component disposed on the base in a pivotal manner and located at a side of the operating component near the second electronic module, an end of the second pivoting component being connected to the second moving component; and
a second latch component connected to another end of the second pivoting component to engage with or disengage from the second electronic module;
wherein when the operating component moves relative to the base from a first position to a second position along the first direction, the first moving component is driven by cooperation of the at least one protruding column and the at least one first sliding slot to move along the second direction to pivot the first pivoting component along a first pivoting direction, so as to disengage the first latch component from the first electronic module to unlock the first electronic module, and when the operating component moves relative to the base from the first position to the third position along a third direction opposite to the first direction, the second moving component is driven by cooperation of the at least one protruding column and the at least one second sliding slot to move along the second direction to pivot the second pivoting component along a second pivoting direction opposite to the first pivoting direction, so as to disengage the second latch component from the second electronic module to unlock the second electronic module.

13. The portable electronic device of claim 12, wherein the at least one first sliding slot comprises a first section and a second section, the first section is substantially parallel to the first direction, the second section extends toward the second direction, the at least one second sliding slot comprises a third section and a fourth section, the third section is substantially parallel to the first direction, and the fourth section extends toward the second direction.

14. The portable electronic device of claim 13, wherein the at least one first sliding slot and the at least one second sliding slot are formed in V shapes and axially symmetrical to each other, a turning joint of the first section and the second section of the at least one first sliding slot substantially coincides with a turning joint of the third section and the fourth section of the at least one second sliding slot, and the at least one protruding column passes through the turning joint of the first section and the second section and the turning joint of the third section and the fourth section when the operating component is located at the first position relative to the base.

15. The portable electronic device of claim 13, wherein an included angle between the first section and the second section and an included angle between the third section and the fourth section are greater than 90 degrees.

16. The portable electronic device of claim 12, wherein the latch mechanism further comprises a first recovering component and a second recovering component, the first recovering component is connected to the first moving component and the base to bias the first moving component to recover along a fourth direction opposite to the second direction, and the second recovering component is connected to the second moving component and the base to bias the second moving component to recover along the fourth direction.

17. The portable electronic device of claim 12, wherein the latch mechanism further comprises a light emitting module comprising a first indicator, a second indicator and a control unit, the first indicator and the second indicator are electrically connected to the control unit, the control unit turns on the first indicator when the first latch component disengages from the first electronic module, and the control unit further turns on the second indicator when the second latch component disengages from the second electronic module.

18. The portable electronic device of claim 17, wherein the first indicator and the second indicator are installed on the base, a first avoiding slot and a second avoiding slot are formed on the first moving component along the second direction and respectively located at positions corresponding to the first indicator and the second indicator to reveal the first indicator and the second indicator, so as to prevent the first moving component from interfering with the first indicator and the second indicator, and a third avoiding slot and a fourth avoiding slot are formed on the second moving component along the second direction and respectively located at positions corresponding to the first indicator and the second indicator to reveal the first indicator and the second indicator, so as to prevent the second moving component from interfering with the first indicator and the second indicator.

19. The portable electronic device of claim 12, wherein the latch mechanism further comprises a stopping assembly comprising a first stopping component and a second stopping component, the first stopping component and the second stopping component are disposed on the base and movable along the first direction and the third direction respectively, the first stopping component selectively abuts against the second electronic module or the first moving component to allow or restrain a displacement of the first moving component along the second direction, and the second stopping component selectively abuts against the first electronic module or the second moving component to allow or restrain a displacement of the second moving component along the second direction.

20. The portable electronic device of claim 19, wherein the second electronic module pushes the first stopping component to depart from the first moving component when the second electronic module is installed beside the base, and the first electronic module pushes the second stopping component to depart from the second moving component when the first electronic module is installed beside the base.

21. The portable electronic device of claim 19, wherein the stopping assembly further comprises a first resilient component and a second resilient component, the first resilient component is connected to the base and the first stopping component to drive the first stopping component to abut against the first moving component to restrain the displacement of the first moving component along the second direction when the second electronic module is not installed beside the base, and the second resilient component is connected to the base and the second stopping component to drive the second stopping component to abut against the second moving component to restrain the displacement of the second moving component along the second direction when the first electronic module is not installed beside the base.

22. The portable electronic device of claim 12, wherein the latch mechanism further comprises a guiding component, at least one first guiding slot and at least one second guiding slot are formed on the guiding component, the operating component further comprises at least one step-shaped guiding structure, and the at least one protruding column and the at least one step-shaped guiding structure pass through the at least one first guiding slot and the at least one second guiding slot respectively, so as to guide the operating component to move along the first direction or the third direction.

* * * * *